United States Patent
Englmeier

(10) Patent No.: US 7,304,689 B2
(45) Date of Patent: Dec. 4, 2007

(54) SINGLE CHIP TUNER FOR MULTI RECEIVER APPLICATIONS

(75) Inventor: Martin H. Englmeier, Lenting (DE)

(73) Assignee: Microtune (Texas), L.P., Plano, TX (US)

(*) Notice: Subject to any disclaimer, the term of this patent is extended or adjusted under 35 U.S.C. 154(b) by 692 days.

(21) Appl. No.: 10/164,935

(22) Filed: Jun. 6, 2002

(65) Prior Publication Data

US 2003/0227574 A1 Dec. 11, 2003

(51) Int. Cl.
*H04N 5/44* (2006.01)
*H04N 5/50* (2006.01)

(52) U.S. Cl. ............. 348/731; 348/725; 348/706

(58) Field of Classification Search ........... 348/731, 348/725, 705, 706; 334/47; 455/132, 133, 455/140, 151.4, 189.1, 191.3; 725/151, 37, 725/38

See application file for complete search history.

(56) References Cited

U.S. PATENT DOCUMENTS

| | | | | |
|---|---|---|---|---|
| 3,739,094 A * | 6/1973 | Griffey | ........ | 348/725 |
| 3,818,349 A * | 6/1974 | Ma | ........ | 455/347 |
| 4,516,170 A * | 5/1985 | Skerlos | ........ | 348/731 |
| 4,581,645 A | 4/1986 | Beyers, Jr. | | |
| 4,598,317 A * | 7/1986 | Yu | ........ | 348/570 |
| 4,633,313 A * | 12/1986 | Mogi et al. | ........ | 348/734 |
| 4,743,968 A * | 5/1988 | Mogi et al. | ........ | 348/725 |
| 4,746,982 A | 5/1988 | Seen et al. | | |
| 4,750,040 A * | 6/1988 | Hakamada | ........ | 348/725 |
| 4,821,097 A * | 4/1989 | Robbins | ........ | 348/485 |
| 4,855,835 A * | 8/1989 | Tobita | ........ | 348/735 |
| 4,866,787 A * | 9/1989 | Olesen | ........ | 725/68 |
| 4,872,054 A * | 10/1989 | Gray et al. | ........ | 348/441 |
| 5,666,646 A * | 9/1997 | McCollum et al. | ........ | 455/8 |
| 5,708,961 A * | 1/1998 | Hylton et al. | ........ | 725/81 |
| 5,787,335 A * | 7/1998 | Novak | ........ | 725/69 |
| 5,936,660 A * | 8/1999 | Gurantz | ........ | 725/71 |
| 5,956,075 A | 9/1999 | Matsuo | | |
| 6,023,585 A * | 2/2000 | Perlman et al. | ........ | 717/178 |
| 6,031,878 A * | 2/2000 | Tomasz et al. | ........ | 375/316 |
| 6,177,964 B1 | 1/2001 | Birleson et al. | | |
| 6,310,661 B1 * | 10/2001 | Arsenault | ........ | 348/725 |
| 6,427,237 B1 * | 7/2002 | Aranguren et al. | ........ | 725/106 |
| 6,538,501 B2 * | 3/2003 | Madni | ........ | 327/563 |
| 6,622,307 B1 * | 9/2003 | Ho | ........ | 725/120 |
| 6,888,580 B2 * | 5/2005 | Dujmenovic | ........ | 348/731 |
| 6,956,623 B1 * | 10/2005 | Staller | ........ | 348/731 |
| 7,053,707 B2 * | 5/2006 | Fanous et al. | ........ | 330/124 R |
| 2001/0029587 A1 * | 10/2001 | Takenaka et al. | ........ | 713/300 |
| 2003/0034843 A1 * | 2/2003 | Fanous et al. | ........ | 330/254 |
| 2003/0169783 A1 * | 9/2003 | Coffin et al. | ........ | 370/536 |

FOREIGN PATENT DOCUMENTS

JP 2001-144640 5/2001

OTHER PUBLICATIONS

U.S. Appl. No. 09/407,734, Birleson.
U.S. Appl. No. 09/572,393, Birleson et al.
PCT International Search Report in PCT/US03/17872 dated Oct. 2, 2003.

* cited by examiner

*Primary Examiner*—Victor R. Kostak
(74) *Attorney, Agent, or Firm*—Fulbright & Jaworski LLP

(57) ABSTRACT

Tuners are adapted to accept a received signal input and provide both a desired tuner output and the received signal as an output. Accordingly, a single tuner circuit, preferably an integrated circuit, may be cascaded to provide a multiple tuner configuration. Any number of such integrated circuit tuners may be cascaded together for a multiple tuner application. Alternative embodiments provide a multiple tuner adapter for cascading devices.

69 Claims, 3 Drawing Sheets

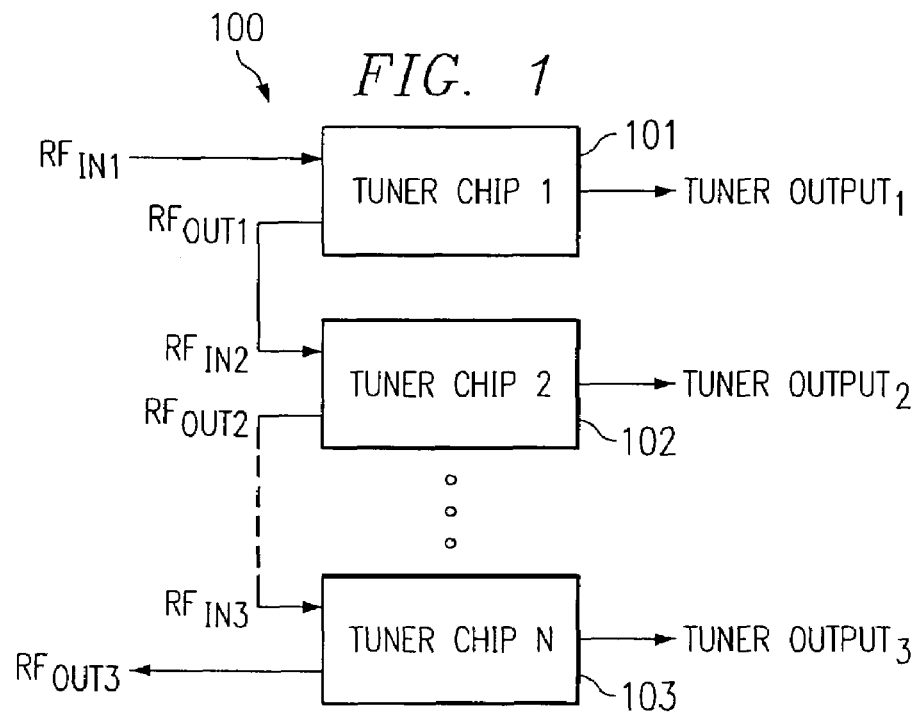
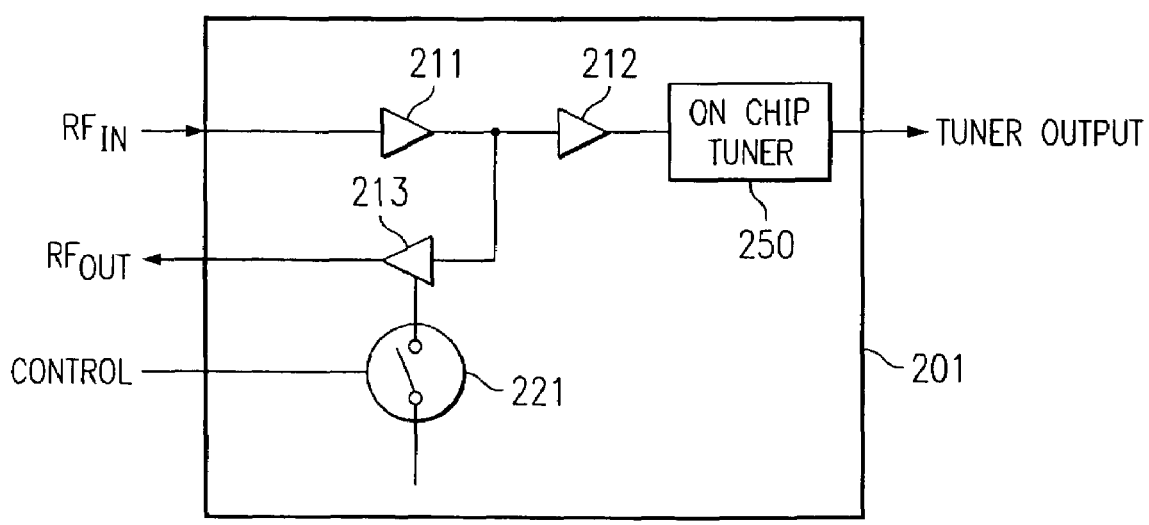

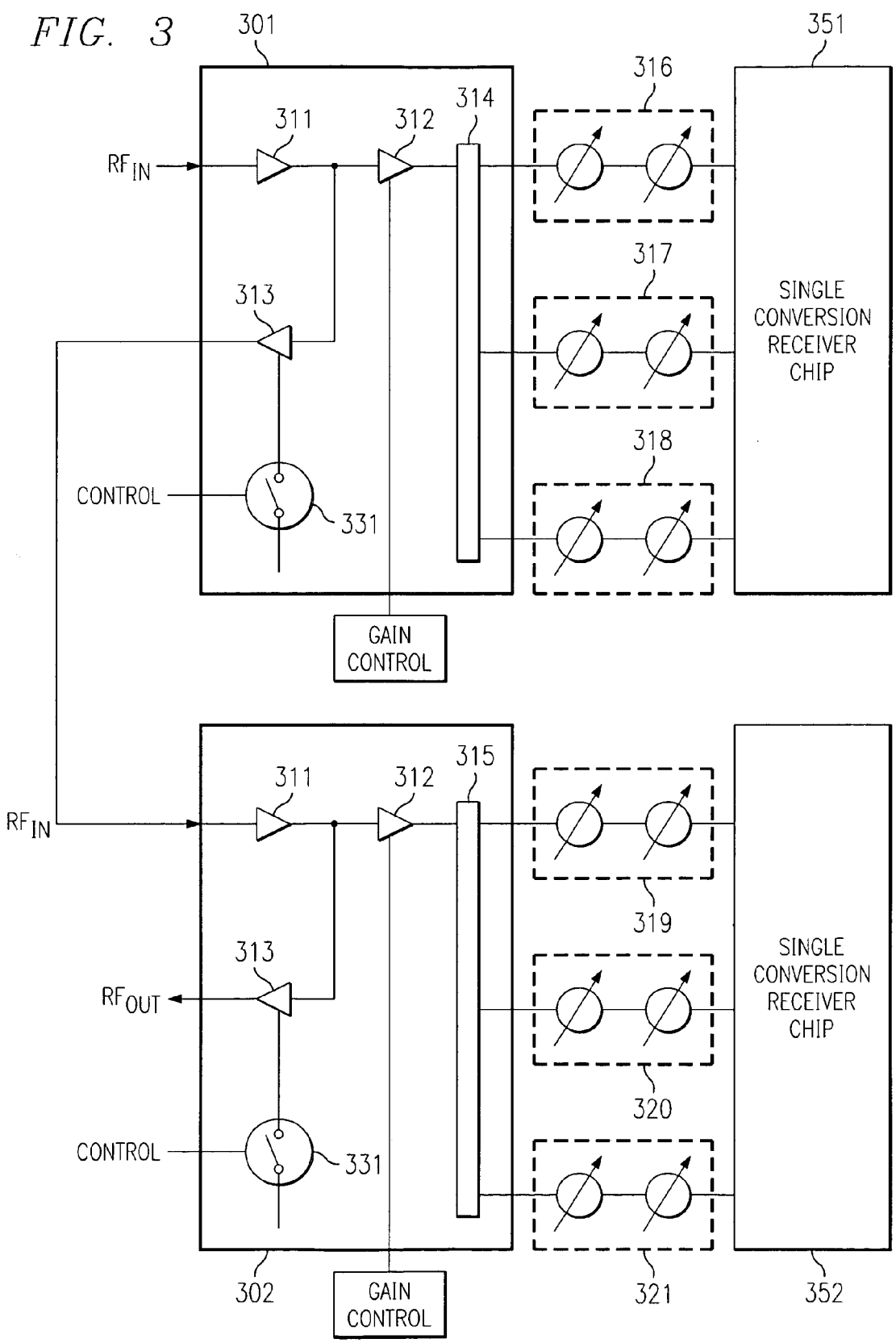

SINGLE CHIP TUNER FOR MULTI RECEIVER APPLICATIONS

CROSS-REFERENCE TO RELATED APPLICATIONS

The present application is related to co-pending and commonly assigned U.S. patent application Ser. No. 09/572,393 entitled "Broadband Integrated Tuner," filed May 15, 2000, which is a continuation of U.S. patent application Ser. No. 08/904,908, now U.S. Pat. No. 6,177,964, entitled "Broadband Integrated Television Tuner," filed Aug. 1, 1997, and U.S. patent application Ser. No. 09/407,734 entitled "System and Method for a Single Conversion Tuner," filed Sep. 28, 1999, the disclosures of which are hereby incorporated herein by reference.

TECHNICAL FIELD OF THE INVENTION

The invention relates to tuner circuits and more particularly to tuner circuit configurations adapted for use in multiple tuner applications.

BACKGROUND OF THE INVENTION

Presently more and more applications using multiple tuners are developing. For example, state-of-the-art consumer electronic devices are beginning to utilize multiple TV tuners, such as for providing picture-in-picture functionality or for recording multiple programs using emerging digital television recording systems. In addition to the above mentioned more traditional television tuner type applications, many less traditional tuner applications which may benefit from the use of multiple tuners are developing, such as the use of television tuners installed in personal computer (PC) systems, thereby allowing the PC to function as a television set or receive data from a broadband broadcast such as in a cable modem system.

However, there is difficulty in providing a configuration of multiple tuners coupled to a common received signal, such as a cable television signal. Many of the multiple tuner applications demand high quality signal output, such as a low bit error rate in the aforementioned cable modem applications or a sharp and relatively high definition image in the aforementioned television picture applications. Moreover, many such applications provide relatively little space for accommodating multiple tuners and associated circuitry. For example, consumer electronic devices, such as television recording systems, and computer components, such as PC expansion boards, are becoming smaller and smaller, thus requiring small footprint components, such as the aforementioned multiple tuner circuits.

One current solution for providing multiple tuners for such applications is to provide splitters, which are devices provided one input and two outputs, in a signal path to provide a received signal to multiple tuners. For example, a first splitter may be provided to couple a received signal to a first tuner and the received signal to a second splitter which, in turn, couples the received signal to a second and third tuner. However, such a solution utilizes an appreciable amount of space to accommodate the splitter network. Moreover, such splitters generally degrade the signal being split and, therefore, are may not be acceptable for providing a desired tuner output signal quality without the addition of discrete amplifier circuits. However, the use of such amplifier components, further aggravates the aforementioned space issues.

Another solution for providing multiple tuners is to utilize devices referred to as "micro-splitters," which are amplifying devices with one input and several outputs, in a signal path to provide a received signal to multiple tuners. For example, a first, second, and third tuner might be connected to a single micro-splitter. Although typically adequately addressing the above mentioned issues with respect to the signal quality of the split signal, micro-splitters still utilize an appreciable amount of space for deployment. Additionally, a variety of micro-splitters must be provided for use with particular numbers of tuners, such as a micro-splitter having two outputs for use with two tuners and a micro-splitter having three outputs for use with three tuners. Accordingly, micro-splitters generally do not provide as low cost of a solution as is desirable.

A need therefore exists in the art for systems and methods which provide for multiple tuner circuits using a minimum of space while maintaining a desired output signal quality. A further need exists in the art for systems and methods allowing for a single circuit configuration to be utilized in providing any number of tuners in a multiple tuner application.

BRIEF SUMMARY OF THE INVENTION

These and other objects, features and technical advantages are achieved by a single tuner circuit adapted according to the present invention to accept a received signal input and provide both a desired tuner output and the received signal as an output, such as may be cascaded to another such tuner circuit. Accordingly, a preferred embodiment of the present invention provides a multiple tuner solution within an integrated circuit tuner. Any number of such integrated circuit tuners may be cascaded together for a multiple tuner application.

Tuners of the present invention are preferably adapted to be deployed in the aforementioned cascade fashion or not, as desired. Because the preferred embodiment tuners support both connection of a subsequent tuner in a "daisy chain" or no subsequent tuner connected thereto, a single tuner component design may be utilized throughout a multiple tuner application. Accordingly, a single tuner component may be manufactured, stocked, and installed for use in such multiple tuner applications, as well as for use in single tuner applications, thus reducing costs associated therewith.

In addition to the aforementioned advantages associated with a single tuner configuration of the present invention being operable in a variety of applications, the preferred embodiment tuner configuration does not require external splitting or amplification devices. Accordingly, the preferred embodiment provides a solution which minimizes the deployment footprint required.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

FIG. 1 shows a multiple tuner configuration using multi-tuners of a preferred embodiment of the present invention;

FIG. 2 shows a preferred embodiment of a multi-tuner of the present invention;

FIG. 3 shows an alternative multiple tuner configuration using multiple tuner adapters of the present invention.

DETAILED DESCRIPTION OF THE INVENTION

Figure 4:
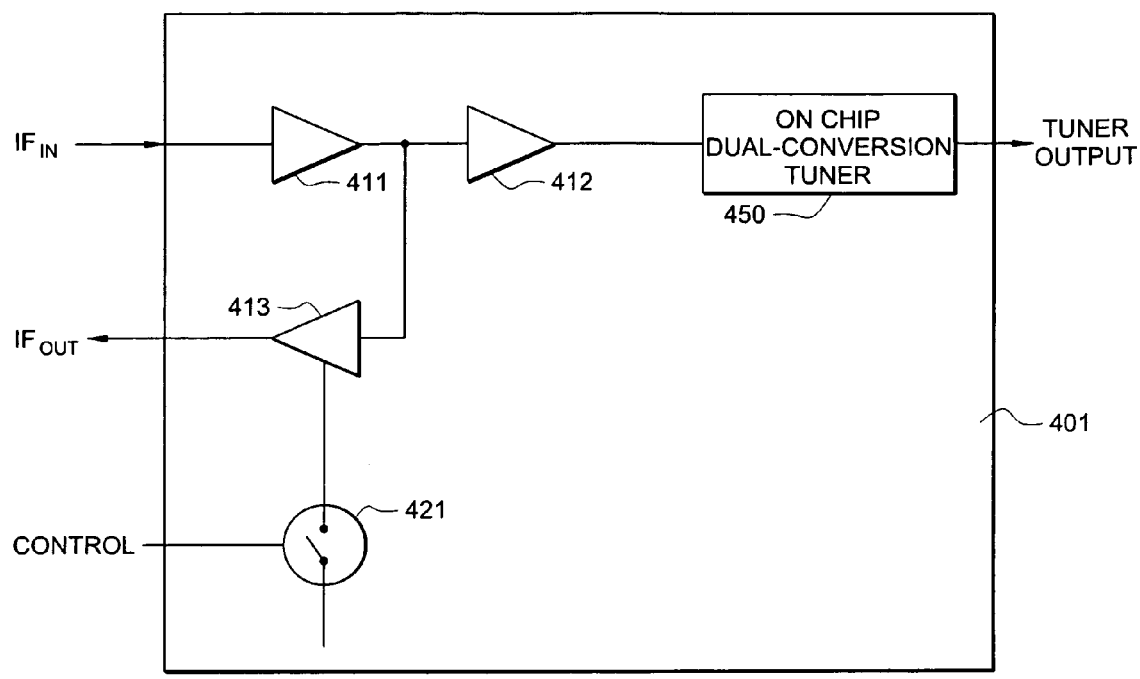
FIG. 4 is a block diagram illustrating multi-tuner 401 configured according to one embodiment of the present invention.

Directing attention to FIG. 1, multiple tuner circuit 100, including multi-tuners 101, 102, and 103 adapted according to a preferred embodiment of the present invention, is shown. Specifically, multiple tuner circuit 100 of the illustrated embodiment is configured to accept a radio frequency (RF) signal input, such as may be a broadband cable television signal, at an input interface of multi-tuner 101, $RFin_1$. The RF input signal is preferably processed by multi-tuner 101 to provide a desired output signal, such as may be a particular channel of the RF input signal down converted to a baseband signal, at an output interface of multi-tuner 101, tuner output$_1$. Moreover, the RF input signal is also preferably provided as an RF output signal at an output interface of multi-tuner 101, $RFout_1$. Accordingly, the RF signal is available for input to additional tuners.

A multiple tuner configuration is provided according to the illustrated embodiment by "daisy chaining" multiple ones of the multi-tuners together. Accordingly, any number of tuners may be daisy chained according to the present invention. As shown in the illustrated embodiment the RF input signal as output by $RFout_1$ of multi-tuner 101 is provided to an input interface of multi-tuner 102, $RFin_2$, for processing by multi-tuner 102 to provide a desired output signal at an output interface of multi-tuner 102, tuner output$_2$. As with multi-tuner 101, the RF input signal is also provided as an RF output signal at an output interface of multi-tuner 102, $RFout_2$, according to the illustrated embodiment. The RF input signal as output by $RFout_2$ of multi-tuner 102 is provided to an input interface of multi-tuner 103, $RFin_3$, for processing by multi-tuner 103 to provide a desired output signal at an output interface of multi-tuner 103, tuner output$_3$. It should be appreciated that, although the illustrated embodiment shows a multiple tuner configuration including 3 multi-tuners, multi-tuners of the present invention may be utilized in configurations of 1 and 2 multi-tuners, in addition to configurations with 3 or more multi-tuners as represented in FIG. 1.

As with multi-tuners 101 and 102, multi-tuner 103 preferably includes an RF signal output interface, $RFout_3$. A preferred embodiment of multi-tuners 101, 102, and 103 provides for selective output of a signal at the RF output interface thereof. For example, a multi-tuner of the present invention may include a control input to allow selective termination of the RF output interface. Additionally or alternatively, multi-tuners of the present invention may provide for controlled attenuation, interruption, or the like of a signal of the RF output interface. Accordingly, output of the RF signal from the last multi-tuner in a chain (or in single tuner implementations) may be prevented, such as for impedance matching or avoiding undesired noise energy. However, in situations where deactivation of the RF output port is unnecessary or where the components of the tuner providing output of the RF signal provide sufficient isolation or impedance matching without preventing output of the RF signal, multi-tuners of the present invention may not be provided with the aforementioned means by which RF signal output is controllably prevented.

It should be appreciated that it may be desirable not to terminate the RF signal output of multi-tuner 103, even when multi-tuner 103 is the last multi-tuner of a multiple tuner configuration. For example, the RF signal may be output from multi-tuner 103 for uses other than additional tuner input, such as to be provided to an output of the application device in order to supply the RF signal to another device for other purposes.

According to alternative embodiments of the present invention, multi-tuner 103 may not include an RF output interface ($RFout_3$), if desired. Accordingly, multi-tuner 103 may be provided by a tuner circuit which is different than that of multi-tuner 101 and 102 for use in terminating the multiple tuner daisy chain.

Directing attention now to FIG. 2, a preferred embodiment implementation of multi-tuners, such as multi-tuners 101, 102, and 103 of FIG. 1, is shown. Specifically, a preferred embodiment tuner for multiple tuner applications is shown as multi-tuner 201. Preferably multi-tuner 201 is provided on a single substrate, such as using large scale integration technology on a substrate such as silicon. Accordingly, each of input buffer amplifier 211, receiver buffer amplifier 212, output buffer amplifier 213, output control circuitry 221, and tuner 250 are preferably implemented as a single integrated circuit component, e.g. "chip." For example, input buffer amplifier 211, receiver buffer amplifier 212, and output buffer amplifier 213 may be embodied as monolithic operational amplifiers as are well known in the art. Output control circuitry 221 may be provided by a monolithic diode and transistor circuit operable to provide biasing of the diode for switching functionality in response to a control signal as is well known in the art. Tuner 250 may be provided by a monolithic tuner structure as shown and described in the above referenced patent application entitled "Broadband Integrated Tuner."

The tuner structure shown and described in the patent application entitled, "Broadband Integrated Tuner," describes a tuner that receives a broad band of RF signals and converts a desired RF television channel to an Intermediate Frequency (IF) signal having a picture carrier at 45.75 MHz. To accomplish this, an architecture was chosen to perform an up conversion of the RF input signal to a higher internal frequency, which allows the described dual-conversion tuner to have minimal filtering on the input stages of the receiver. This dual-conversion tuner is, therefore, able to operate without variable-tuned input filtering. This eliminates the need for precisely controlled variable tuned filters which must be mechanically aligned during manufacture and are subject to variation in performance due to age, temperature, humidity, vibration and power supply performance. This was a critical drawback of previous tuners that had to be eliminated because it is a source of tremendous error and distortion, as well as complexity.

This dual-conversion tuner allows a wide band of frequencies to enter the front end of the tuner circuit without removing frequencies in an input band pass tracking filter. An input filter allows RF signals, typically in the range from 55-806 MHz, to enter the circuit while rejecting high frequency signals above the television band. The input signal then passes through a low noise amplifier that controls the input signal level. Following the input filter and amplifier, the RF signal is converted to an IF signal in a dual mixer conversion circuit. The conversion circuit generally up-converts the RF to a first IF signal and then down-converts the first IF signal to a second IF signal having a 45.75 MHz picture carrier.

The up-conversion performed on chip avoids drive capability problems associated with high frequency signals and noise coupling problems resulting from integrated circuit external interconnections. Following the up-conversion, a first IF band pass filter performs coarse channel selection. The described dual-conversion tuner next performs a down conversion on the output of the first IF filter. The down-conversion may be accomplished by an image rejection mixing scheme that provides for a higher level of image rejection than that provided solely by the first IF filter. The use of an image rejection mixer for down-converting the first IF signal is optional depending upon the characteristics of the first IF filter and its ability to reject unwanted signals.

The described dual-conversion tuner uses much less board space than previous designs (on the order of 5% to 10% of the prior art designs) and has the potential to dissipate less power. This tuner also operates on a single voltage level, as opposed to two or three levels for previous designs.

In operation according to the preferred embodiment, input buffer amplifier 211 provides low noise amplification of an RF signal provided to the input interface RFin to control the signal level thereof. Thereafter, the RF signal is distributed, such as by a coupler disposed in the signal path after input buffer amplifier 211, for providing to tuner 250 and for output at output interface RFout. According to the preferred embodiment, buffer amplifier 212 provides low noise amplification of the RF signal as distributed to tuner 250 to thereby provide a signal level suitable for receiver operation by tuner 250. Similarly, buffer amplifier 213 preferably provides low noise amplification of the RF signal as distributed for output at output interface RFout to thereby provide an output signal level suitable for downstream operation, such as coupling to subsequent tuners of the present invention or to be provided to an output of the application device in order to supply the RF signal to another device for other purposes.

According to a preferred embodiment, output control circuitry 221 is coupled to output buffer amplifier 213 in order to provide for controlled operation thereof. Specifically, a control signal may be provided to output control circuitry 221 to selectively cause output buffer amplifier 213 to pass the RF signal through to output interface RFout. For example, where multi-tuner 201 is utilized in a single tuner application or is provided as a last tuner in a multiple tuner daisy chain, an appropriate control signal may be provided to output control circuitry 221, such as through the control interface labeled "control," to thereby cause output buffer amplifier 213 to terminate the RF signal. It should be appreciated that control of output control circuitry 221 may be provided without utilization of a discrete control interface. For example, control of output control circuitry 221 may be provided through an existing digital control network associated with tuner 250 (not shown).

It should be appreciated that alternative embodiments of the invention may be configured differently than shown in FIG. 2. For example, one or more of buffer amplifiers 211, 212, and 213 may be omitted, if desired, such as where signal levels and/or signal quality are such that buffering is not necessary at one or more points in the signal path. Similarly, output control circuitry 221 may be omitted, if desired, such as where output buffer amplifier 213 provides a desired level of isolation or impedance matching without preventing output of the RF signal.

Moreover, circuitry in addition to that illustrated may additionally or alternatively be utilized according to the present invention. For example, gain control circuitry may be coupled to one or more of buffer amplifiers 211, 212, and 213 to provide controllable operation thereof. Additionally, signal path selection circuitry, such as a controllable switch, may be provided for directing signals within multi-tuner 201. For example, where single conversion tuner technology, such as shown and described in the above reference patent application entitled "System and Method for a Single Conversion Tuner," is used, it may be desirable to provide switching of the RF signal between various frequency filters provided as a front end to the single conversion tuner circuit. Such a single conversion tuner circuit and associated front end is shown with respect to an alternative embodiment in FIG. 3 discussed below.

An alternative embodiment of circuitry for providing a multiple tuner implementation is shown in FIG. 3. In the embodiment of FIG. 3, circuitry adapted for daisy chaining any number of tuners, similar to that shown in FIG. 2, is shown as multiple tuner adapters 301 and 302. It should be appreciated that the multiple tuner adapters of the present invention may be utilized with any number of tuners to provide a multiple tuner configuration as discussed with respect FIG. 1 above. Accordingly, like multi-tuner 201 of FIG. 2, multiple tuner adapters 301 and 302 of the illustrated embodiment include input buffer amplifier 311, receiver buffer amplifier 312, output buffer amplifier 313, and output control circuitry 321 to provide operation as described above with respect to FIG. 2. Of course, alternative embodiments of the multiple tuner adapters may omit one or more of these components and/or include additional components as described above with respect to FIG. 2, if desired.

Preferably multiple tuner adapters of the present invention, such as multiple tuner adapter 301, are provided on a single substrate, such as using large scale integration technology on a substrate such as silicon. Accordingly, each of multiple tuner adapter 301 and multiple tuner adapter 302 are preferably implemented as an integrated circuit component, e.g., a "chip." Of course, an integrated circuit (chip) may be provided with several multiple tuner adapters of the present invention, if desired.

It should be appreciated that the multiple tuner adapters of FIG. 3 include gain control circuitry coupled to buffer amplifiers 312. According to a preferred embodiment this gain control circuitry is operable to provide a desired signal level input to a coupled tuner, e.g., single conversion tuners 351 and 352. Alternative embodiments of the invention may omit such gain control circuitry, such as where the coupled devices are less sensitive to input signal levels.

Additionally, it should be appreciated that the multiple tuner adapters of FIG. 3 include signal path selection circuitry, shown as controllable switching circuitry 314 & 315, provided for directing signals of multiple tuner adapters 301 and 302. Specifically, single conversion tuners 351 and 352 include three frequency filters 316-321 coupled thereto for use depending upon the channel or portion of a received RF signal to be converted by the tuner. Accordingly, the illustrated embodiments of multiple tuner adapters 301 and 302 provide switching of the RF signal between the various frequency filters, such as filters 316-321, as a function of the channel or portion of the RF signal to be utilized by the corresponding tuners. Of course, alternative embodiments of the invention may omit such signal path selection circuitry 314 & 315, such as where single input double conversion tuners are used, if desired, as shown in FIG. 2.

Although preferred embodiments of the present invention have been described with reference to RF signals, it should be appreciated that there is no limitation that the present invention operate with respect to RF signal processing. For example, multi-tuners and multiple tuner adapters of the present invention may operate with intermediate frequency (IF) input. Moreover, there is no limitation that the present invention operate with respect to tuner circuitry. For example, the multi-tuners of FIG. 2 may be adapted to include a digital signal processor in place of the tuner of the illustrated embodiment. Similarly, the multiple tuner adapters of FIG. 3 may be coupled to any number of devices, such as modems, radios, and the like, for which a particular input signal is to be provided to a multiple device application.

FIG. 4 is a block diagram illustrating multi-tuner 401 configured according to one embodiment of the present invention. Multi-tuner 401 is provided on a single substrate, such as using large scale integration technology on a substrate such as silicon. Accordingly, each of input buffer amplifier 411, receiver buffer amplifier 412, output buffer amplifier 413, output control circuitry 421, and dual-conversion tuner 450 are implemented as a single integrated circuit component, e.g. "chip." For example, input buffer amplifier 411, receiver buffer amplifier 412, and output buffer amplifier 413 may be embodied as monolithic operational amplifiers, as are well known in the art. Output control circuitry 421 may be provided by a monolithic diode and transistor circuit operable to provide biasing of the diode for switching functionality in response to a control signal, as is well known in the art. Dual-conversion tuner 450 may be provided by a monolithic tuner structure as shown and described in the above referenced patent application entitled "Broadband Integrated Tuner."

In operation according to the illustrated embodiment, input buffer amplifier 411 provides low noise amplification of an RF signal provided to the input interface IFin to control the signal level thereof. Thereafter, the IF signal is distributed, such as by a coupler disposed in the signal path after input buffer amplifier 411, for providing to dual-conversion tuner 450 and for output at output interface IFout. According to the illustrated embodiment, buffer amplifier 412 provides low noise amplification of the IF signal as distributed to dual-conversion tuner 450 to thereby provide a signal level suitable for receiver operation by dual-conversion tuner 450. Similarly, buffer amplifier 413 provides low noise amplification of the IF signal as distributed for output at output interface IFout to thereby provide an output signal level suitable for downstream operation, such as coupling to subsequent tuners of the present invention or to be provided to an output of the application device in order to supply the IF signal to another device for other purposes.

Output control circuitry 421 is coupled to output buffer amplifier 413 to provide for controlled operation thereof. Specifically, a control signal may be provided to output control circuitry 421 to selectively cause output buffer amplifier 413 to pass the IF signal through to output interface IFout. For example, where multi-tuner 401 is utilized in a single tuner application or is provided as a last tuner in a multiple tuner daisy chain, an appropriate control signal may be provided to output control circuitry 421, such as through the control interface labeled "control," to thereby cause output buffer amplifier 413 to terminate the IF signal. It should be appreciated that control of output control circuitry 421 may be provided without utilization of a discrete control interface. For example, control of output control circuitry 421 may be provided through an existing digital control network associated with dual-conversion tuner 450 (not shown).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or late to be developed that perform substantially the same result as the corresponding embodiments described herein may be utilized according to the present invention. Accordingly, the appended claims are intended to include within their scope such processes, machines, manufacture, compositions of matter, means, methods, or steps.

What is claimed as new and desired to be protected by Letters Patent of the United States is:

1. An integrated circuit operable in a variety of signal processing applications, ones of said variety of signal processing applications requiring a different number of tuners, said integrated circuit comprising:
   a signal input for accepting a signal stream including a signal portion to be processed by said integrated circuit;
   a processed signal output coupled to said signal input for outputting said signal portion processed by said integrated circuit;
   a signal stream output coupled to said signal input for outputting said signal stream; and
   an output signal controller coupled to said signal stream output for selectively activating output of said signal stream as a function of a number of tuners required by one of said variety of signal processing applications where said integrated circuit is installed.

2. The integrated circuit of claim 1, further comprising:
   a tuner circuit coupled in a signal path between said signal input and said processed signal output, wherein said tuner provides said processing of said signal portion.

3. The integrated circuit of claim 2, wherein said one of said variety of signal processing applications is a dual tuner application.

4. The integrated circuit of claim 2, wherein said one of said variety of signal processing applications is a single tuner application.

5. The integrated circuit of claim 2, wherein said one of said variety of signal processing applications is a multiple tuner application.

6. The integrated circuit of claim 1, wherein said multiple signal processing configuration comprises a plurality of said integrated circuits coupled through a corresponding one of said signal stream output and said signal input to form a daisy chain of integrated circuits.

7. The integrated circuit of claim 6, wherein said daisy chain of integrated circuits comprises at least 3 said integrated circuits.

8. The integrated circuit of claim 1, further comprising:
a buffer amplifier coupled in a signal path between said signal input and said processed signal output.

9. The integrated circuit of claim 8, further comprising:
a coupler disposed in the signal path between said signal input and said processed signal output, wherein said coupler is coupled to said signal stream output.

10. The integrated circuit of claim 9, wherein said buffer amplifier is coupled in said signal path between said signal input and said coupler.

11. The integrated circuit of claim 9, wherein said buffer amplifier is coupled in said signal path between said coupler and said processed signal output.

12. The integrated circuit of claim 11, further comprising:
gain control circuitry coupled to said buffer amplifier.

13. The integrated circuit of claim 1, further comprising:
a buffer amplifier coupled in a signal path between said signal input and said signal stream output.

14. The integrated circuit of claim 13, further comprising:
control circuitry coupled to said buffer amplifier, wherein said control circuitry is operable to control said buffer amplifier to selectively pass said signal stream to said signal stream output.

15. The integrated circuit of claim 1, further comprising:
signal path selection circuitry coupled in a signal path between said signal input and said processed signal output, wherein said signal path selection circuitry is controllably operable to select from a plurality of signal paths.

16. The integrated circuit of claim 1, wherein said accepted signal stream comprises a broadband signal stream and said signal portion processed by said integrated circuit comprises a baseband signal.

17. The integrated circuit of claim 16, wherein said broadband signal is an RF signal.

18. The integrated circuit of claim 16, wherein said broadband signal is an IF signal.

19. The integrated circuit of claim 16, wherein said broadband signal comprises a cable television signal.

20. A tuner apparatus for use in a variety of multiple tuner applications, ones of said multiple tuner applications requiring a different number of tuners, said apparatus comprising:
a broadband signal input for accepting a broadband signal;
a tuner circuit coupled to said signal input for accepting said broadband signal and providing a baseband signal;
a baseband signal output coupled to said tuner circuit for outputting said baseband signal;
a broadband signal output coupled to said broadband signal input for outputting said broadband signal; and
control circuitry coupled to said broadband signal output to thereby selectively enable output of said broadband signal at said broadband signal output as a function of a number of tuners required by one of said variety of multiple tuner applications where said tuner apparatus is installed.

21. The apparatus of claim 20, wherein said broadband signal is at an RF.

22. The apparatus of claim 20, wherein said broadband signal is at an IF.

23. The apparatus of claim 20, wherein said broadband signal comprises a cable television signal.

24. The apparatus of claim 20, wherein said one of said multiple tuner applications is a dual conversion application.

25. The apparatus of claim 20, wherein said one of said multiple tuner applications is a single conversion application.

26. The apparatus of claim 20, wherein said baseband signal comprises a television channel signal.

27. The apparatus of claim 20, wherein said baseband signal comprises a data signal.

28. The apparatus of claim 27, wherein said data signal is associated with a cable modem service.

29. The apparatus of claim 20, further comprising:
a buffer amplifier disposed in a signal path between said broadband signal input and said tuner circuit.

30. The apparatus of claim 29, further comprising:
gain control circuitry coupled to said buffer amplifier to thereby provide signal level control to a signal provided to said tuner circuit.

31. The apparatus of claim 20, further comprising:
a buffer amplifier disposed in a signal path between said broadband signal input and said broadband signal output.

32. The apparatus of claim 31, further comprising:
control circuitry coupled to said buffer amplifier to thereby provide selective output of said broadband signal at said broadband signal output.

33. The apparatus of claim 20, wherein said multiple tuner configuration comprises a plurality of said apparatuses coupled through corresponding ones of said broadband signal output and said broad band signal input.

34. The apparatus of claim 20, wherein said apparatus is disposed upon a single substrate using integrated circuit technology.

35. A method for providing a multiple tuner configuration operable in a variety of signal processing applications, ones of said variety of signal processing applications requiring a different number of tuners, said method comprising:
providing a first integrated circuit tuner having a first broadband signal input, a first broadband signal output, and a first baseband signal output;
providing a second integrated circuit tuner having a second broadband signal input, a second broadband signal output, and a second baseband signal output;
coupling said first integrated circuit tuner to said second integrated circuit tuner using said first broadband signal output and said second broadband signal input; and
selectively enabling said first broadband signal output with control circuitry coupled to said first broadband signal output as a function of a number of tuners required by one of said variety of signal processing application where said first and second integrated circuit tuners are installed.

36. The method of claim 35, further comprising:
controlling said second integrated circuit tuner to terminate said second baseband signal output when no apparatus is coupled thereto.

37. The method of claim 35, further comprising:
providing a third integrated circuit tuner having a third broadband signal input, a third broadband signal output, and a third baseband signal output;
coupling said second integrated circuit tuner to said third integrated circuit tuner using said second broadband signal output and said third broadband signal input; and
selectively controlling said second broadband signal output with control circuitry coupled to said second broadband signal output.

38. A multiple tuner system operable in a variety of multiple tuner applications, ones of said variety of multiple tuner applications requiring a different number of tuners, said multiple tuner system comprising:

a first integrated circuit tuner having a first broadband signal input, a first broadband signal output, and a first baseband signal output; and a second integrated circuit tuner having a second broadband signal input and a second baseband signal output, wherein said first integrated circuit tuner is coupled to said second integrated circuit tuner using said first broadband signal output and said second broadband signal input;

wherein said first integrated circuit tuner includes first control circuitry for selectively preventing a signal from passing to said first broadband signal output as a function of a number of tuners required by one of said variety of multiple tuner applications, and said second integrated circuit tuner includes second control circuitry for selectively preventing a signal from passing to said second broadband signal output as a function of said number of tuners required by said one of said variety of multiple tuner applications.

39. The system of claim 38, wherein said second integrated circuit tuner includes a second broadband signal output.

40. The system of claim 39, further comprising:
a third integrated circuit tuner having a third broadband signal input and a third baseband signal output, wherein said second integrated circuit tuner is coupled to said third integrated circuit tuner using said second broadband signal output and said third broadband signal input.

41. The system of claim 40, wherein said third integrated circuit tuner includes a third broadband signal output.

42. The system of claim 38, wherein said first control circuitry is manipulated to allow said signal to pass to said first broadband signal output and said second control circuitry is manipulated to prevent said signal from passing to said second broadband signal output.

43. The system of claim 38, wherein said first integrated circuit tuner includes a frequency tuning circuit coupled between said first broadband signal input and said first baseband signal output.

44. The system of claim 43, wherein said first integrated circuit tuner includes a first input buffer amplifier coupled to said first broadband signal input, a first receiver buffer amplifier coupled to said frequency tuning circuit, and a first output buffer amplifier coupled to said first broadband signal output.

45. The system of claim 44, wherein said first integrated circuit tuner includes a gain control circuit coupled to said first input buffer amplifier.

46. The system of claim 44, wherein said first integrated circuit tuner includes a gain control circuit coupled to said first receiver buffer amplifier.

47. The system of claim 44, wherein said first integrated circuit tuner includes a gain control circuit coupled to said first output buffer amplifier.

48. An integrated multi-tuner circuit having two or more tuner circuits controllably connectable in a cascaded configuration, wherein a first tuner circuit of said multi-tuner circuit comprises a switching circuit operable to control the coupling of a received signal to a second tuner circuit of said multi-tuner circuit to provide said cascaded configuration upon command as a function of a number of tuners required by a multi-tuner application served by said integrated multi-tuner circuit.

49. The integrated multi-tuner circuit of claim 48, wherein said command causes said control circuit to couple said second turner circuit to said received signal when said multi-tuner application requires operation of both said first and second tuner circuits.

50. The integrated multi-tuner circuit of claim 48, wherein said command causes said control circuit to decouple said second turner circuit from said received signal when said multi-tuner application does not require operation of said second tuner circuit.

51. The integrated multi-tuner circuit of claim 48, wherein said first and second tuner circuits are operable to tune different signals from said received signal.

52. The integrated multi-tuner circuit of claim 51, wherein said first tuner circuit tunes a television signal and said second tuner tunes a cable modem signal.

53. The integrated multi-tuner circuit of claim 51, wherein said first tuner circuit tunes a cable modem signal and said second tuner circuit tunes a television signal.

54. The integrated multi-tuner circuit of claim 48, wherein said command causes said control circuit to decouple said second turner circuit from said received signal to meet an impedance matching requirement of said multi-tuner application.

55. The integrated multi-tuner circuit of claim 48, wherein said command causes said control circuit to decouple said second turner circuit from said received signal to meet a noise reduction requirement of said multi-tuner application.

56. The integrated multi-tuner circuit of claim 48, further comprising a third tuner circuit wherein said second tuner circuit of said multi-tuner circuit comprises another switching circuit operable to control the coupling of said received signal to said third tuner circuit of said multi-tuner circuit.

57. A multi-tuner circuit comprising a plurality of tuner circuits controllably connectable in a cascaded configuration, wherein a first tuner circuit comprises a control circuit coupled to an RF output interface, said control circuit operable to control said RF output interface as a function of a number of tuners required by a multi-tuner application served by said multi-tuner circuit.

58. The multi-tuner circuit of claim 57, wherein said control circuit terminates said RF output interface in a single tuner implementation.

59. The multi-tuner circuit of claim 57, wherein said control circuit connects said RF output interface in a multiple tuner implementation.

60. The multi-tuner circuit of claim 57, wherein said control circuit is operable to controllably attenuate a signal at said RF output interface.

61. The multi-tuner circuit of claim 57, wherein said plurality of tuner circuits comprises a single integrated circuit component.

62. A method comprising:
providing two or more tuner circuits controllably connectable in a cascaded configuration, wherein a first tuner circuit of said two or more tuner circuits comprises a switching circuit operable to control the coupling of a received signal to a second tuner circuit of said two or more tuner circuits to provide said cascaded configuration upon command; and issuing said command to control operation of said second tuner circuit as a function of a number of tuners required by a multi-tuner application served by said two or more tuner circuits.

63. The method of claim 62, wherein said command causes said control circuit to couple said second turner circuit to said received signal when said multi-tuner application requires operation of both said first and second tuner circuits.

64. The method of claim 62, wherein said command causes said control circuit to decouple said second turner circuit from said received signal when said multi-tuner application does not require operation of said second tuner circuit.

65. The method of claim 62, wherein said first and second tuner circuits are operable to tune different signals from said received signal.

66. The method of claim 65, wherein said first tuner circuit tunes a television signal and said second tuner tunes a cable modem signal.

67. The method of claim 65, wherein said first tuner circuit tunes a television signal and said second tuner circuit tunes a cable modem signal.

68. The method of claim 62, wherein said command causes said control circuit to decouple said second turner circuit from said received signal to meet an impedance matching requirement of said multi-tuner application.

69. The method of claim 62, wherein said command causes said control circuit to decouple said second turner circuit from said received signal to meet a noise reduction requirement of said multi-tuner application.

* * * * *